(12) United States Patent
Sato

(10) Patent No.: US 12,136,606 B2
(45) Date of Patent: Nov. 5, 2024

(54) MEMORY CARD AND MEMORY SYSTEM

(71) Applicant: Kioxia Corporation, Tokyo (JP)

(72) Inventor: Yuki Sato, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 341 days.

(21) Appl. No.: 17/691,592

(22) Filed: Mar. 10, 2022

(65) Prior Publication Data

US 2023/0091779 A1 Mar. 23, 2023

(30) Foreign Application Priority Data

Sep. 17, 2021 (JP) .................................. 2021-152356

(51) Int. Cl.
| | |
|---|---|
| *H01L 23/40* | (2006.01) |
| *H01L 23/498* | (2006.01) |
| *H01L 25/065* | (2023.01) |
| *H01L 25/18* | (2023.01) |
| *H01R 12/71* | (2011.01) |
| *H05K 1/02* | (2006.01) |
| *H05K 1/18* | (2006.01) |

(52) U.S. Cl.
CPC .......... *H01L 25/0652* (2013.01); *H01L 23/40* (2013.01); *H01L 23/49838* (2013.01); *H01L 25/18* (2013.01); *H01R 12/714* (2013.01); *H05K 1/0204* (2013.01); *H05K 1/181* (2013.01); *H05K 2201/10189* (2013.01); *H05K 2201/10393* (2013.01)

(58) Field of Classification Search
None
See application file for complete search history.

(56) References Cited

U.S. PATENT DOCUMENTS

| | | | |
|---|---|---|---|
| 10,881,027 B2 | 12/2020 | Burke et al. | |
| 2007/0158440 A1 | 7/2007 | Nishizawa et al. | |
| 2020/0090020 A1 | 3/2020 | Fujimoto et al. | |
| 2020/0401326 A1 | 12/2020 | Fujimoto et al. | |
| 2021/0055866 A1* | 2/2021 | Fujimoto | G06K 19/07743 |

FOREIGN PATENT DOCUMENTS

CN 1996579 A 7/2007

* cited by examiner

*Primary Examiner* — Tho D Ta
(74) *Attorney, Agent, or Firm* — Holtz, Holtz & Volek PC

(57) ABSTRACT

According to one embodiment, in a memory card, a sealing portion houses the memory chip and the controller chip and includes a first main surface and a second main surface arranged on an opposite side of the first main surface. A first terminal group includes a plurality of electrode terminals arranged in a first direction inside the first main surface. A second terminal group includes a plurality of electrode terminals arranged in the first direction inside the first main surface. A conductive pattern is arranged between the first terminal group and the second terminal group in the first main surface. A conductive pattern has a longer dimension than that of the electrode terminal in the first terminal group. The conductive pattern has a longer dimension than that of the electrode terminal in the second terminal group. The conductive pattern is in a planar shape.

17 Claims, 12 Drawing Sheets

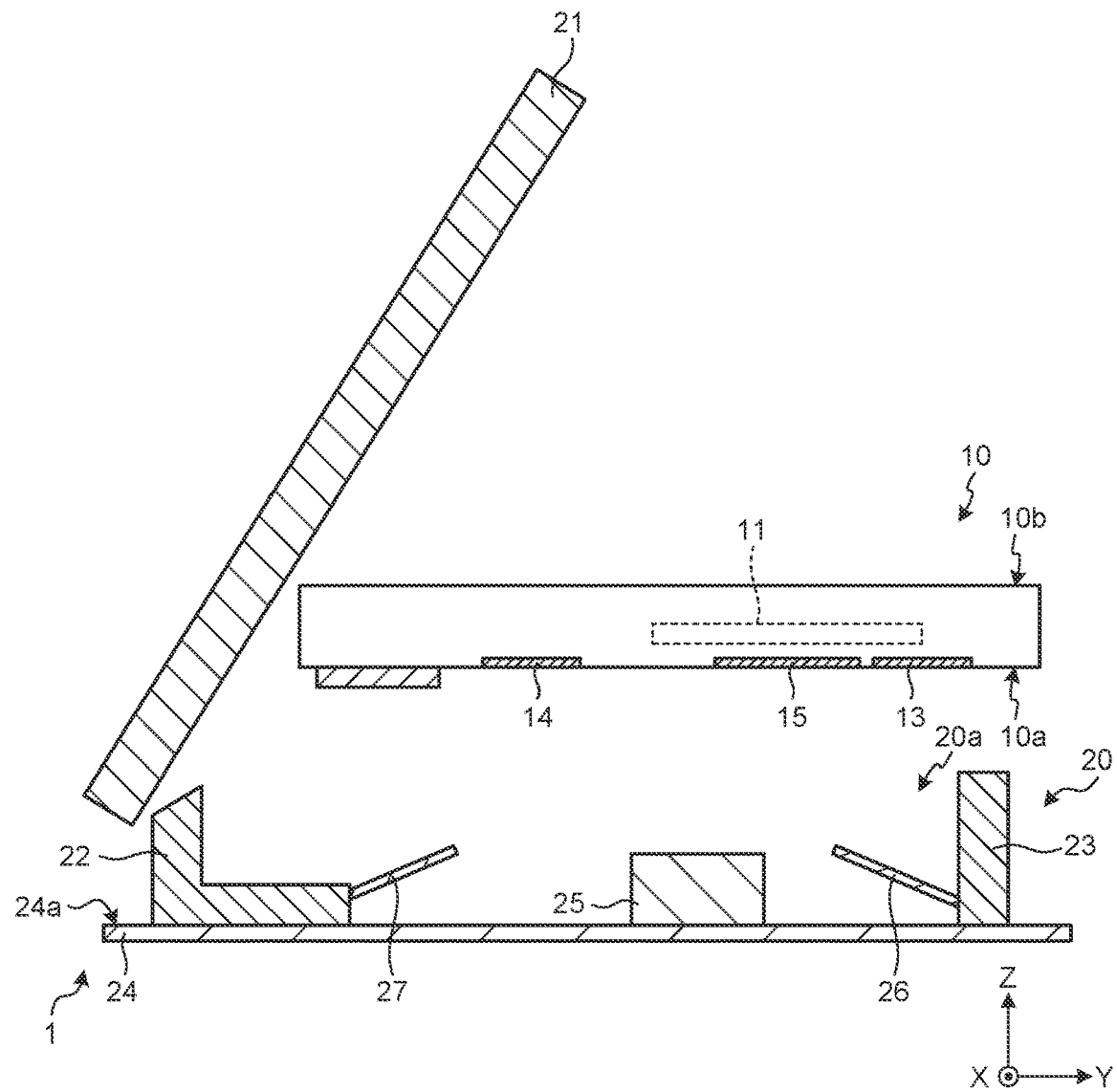
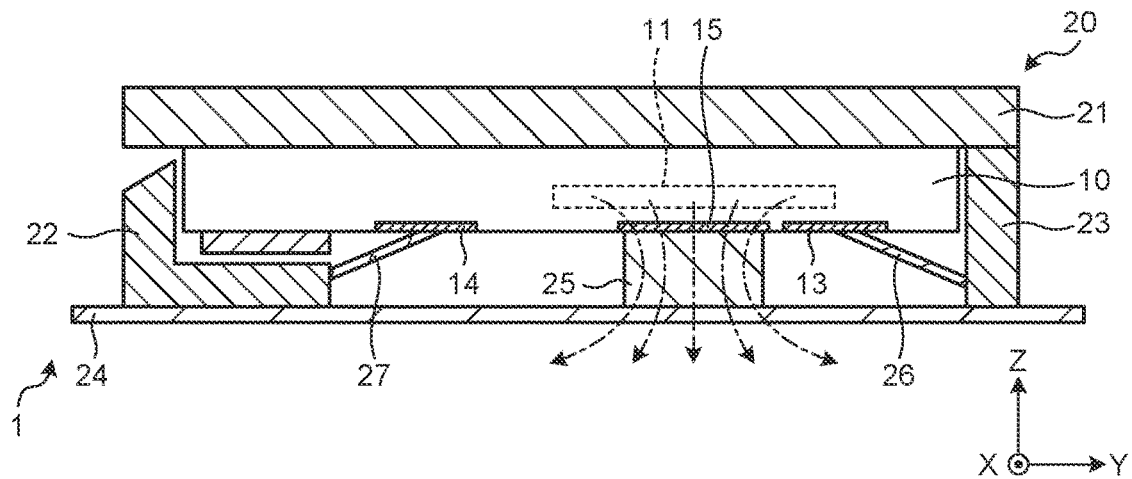

_(1)_

MEMORY CARD AND MEMORY SYSTEM

CROSS-REFERENCE TO RELATED APPLICATIONS

This application is based upon and claims the benefit of priority from Japanese Patent Application No. 2021-152356, filed on Sep. 17, 2021; the entire contents of which are incorporated herein by reference.

FIELD

Embodiments described herein relate generally to a memory card and a memory system.

BACKGROUND

In a memory card in which a memory chip and a controller chip are housed in a sealing portion, the controller chip may generate heat during the operation. It is desirable to efficiently dissipate heat from the memory card.

BRIEF DESCRIPTION OF THE DRAWINGS

FIGS. 2A and 2B are cross-sectional views illustrating heat dissipation of a memory card according to the embodiment;

DETAILED DESCRIPTION

In general, according to one embodiment, there is provided a memory card including a memory chip, a controller chip, a sealing portion, a first terminal group, a second terminal group and a conductive pattern. The sealing portion houses the memory chip and the controller chip and includes a first main surface and a second main surface arranged on an opposite side of the first main surface. The first terminal group includes a plurality of electrode terminals arranged in a first direction inside the first main surface. The second terminal group includes a plurality of electrode terminals arranged in the first direction inside the first main surface. The conductive pattern is arranged between the first terminal group and the second terminal group in the first main surface. The conductive pattern has a longer dimension than that of the electrode terminal in the first terminal group. The conductive pattern has a longer dimension than that of the electrode terminal in the second terminal group. The conductive pattern is in a planar shape.

Exemplary embodiments of a memory system will be explained below in detail with reference to the accompanying drawings. The present invention is not limited to the following embodiments.

Embodiment

Figure 1:
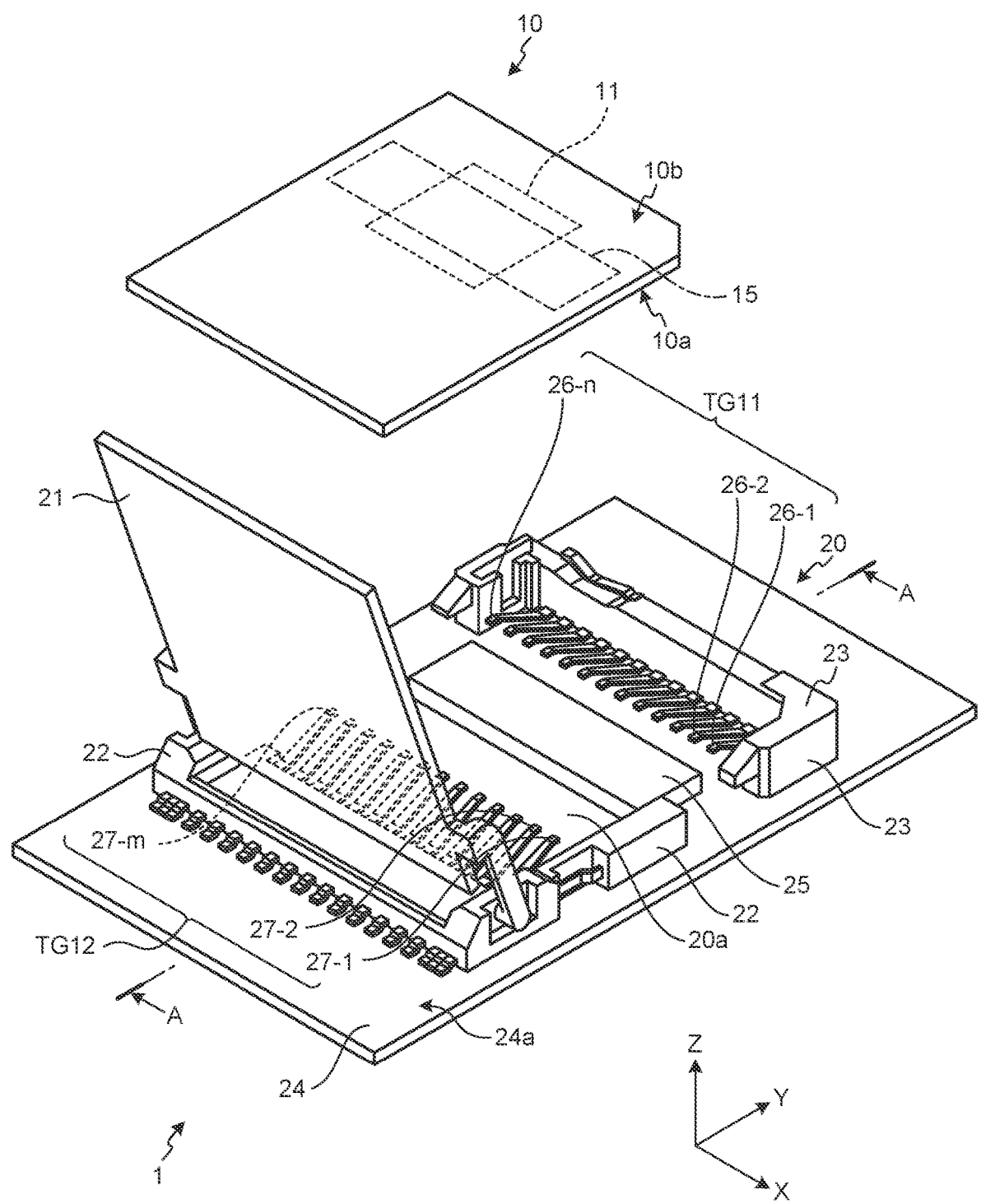
FIG. 1 is a perspective view illustrating a configuration of a memory system according to an embodiment.

A memory system according to an embodiment enables a memory card to be attached to a socket and has a structure of dissipating heat of the memory card when the memory card is attached to the socket. For example, as illustrated in FIG. 1, a memory system 1 includes a memory card 10 and a socket 20. FIG. 1 is a perspective view illustrating a configuration of the memory system 1. Hereinbelow, a direction perpendicular to a front surface 10a of the memory card 10 is referred to as a Z direction, and two directions orthogonal to each other in a plane perpendicular to the Z direction are referred to as an X direction and a Y direction.

The memory card 10 is formed substantially in a rectangular shape having a longitudinal direction thereof in the Y direction in the XY planar view. The socket 20 has a recessed space 20a capable of housing the memory card 10. The recessed space 20a is formed substantially in a rectangular shape having a longitudinal direction thereof in the Y direction in the XY planar view. As illustrated in FIGS. 2A and 2B, the memory card 10 can be attached to the socket 20 by being fitted into the recessed space 20a with the front surface 10a facing the socket 20. FIGS. 2A and 2B are diagrams illustrating attachment and heat dissipation of the memory card 10. Each of FIGS. 2A and 2B corresponds to a cross section taken along the line A-A in FIG. 1. FIG. 2A illustrates a state before the memory card 10 is attached, and FIG. 2B illustrates a state in which the memory card 10 has been attached.

The memory card 10 is electrically connectable to a host (not illustrated) via the socket 20 in a state of being attached to the socket 20. In this state, a controller chip 11 in the memory card 10 can communicate with the host and perform operations such as reading and writing of data from and into a memory chip. In the memory card 10, the controller chip 11 can generate heat during this operation.

To deal with this, the front surface 10a of the memory card 10 has a planar conductive pattern 15 at a position overlapping with the controller chip 11 when viewed in the Z direction. Also, the socket 20 has a heat conductive plate-like member 25 at a position that can come into contact with the conductive pattern 15. The conductive pattern 15 comes into contact with the plate-like member 25 in a state where the memory card 10 is attached to the socket 20. As a result, as indicated by the alternate long and short dash lines in FIG. 2B, heat generated in the controller chip 11 in the memory card 10 can efficiently be dissipated via the conductive pattern 15 and the plate-like member 25.

Note that the heat dissipation path illustrated in FIG. 2B is illustrative, and is not necessarily selected. The heat transferred to the plate-like member 25 may be dissipated to surrounding gases via a substrate 24, or may be dissipated to a host-side member (not illustrated) connected to the substrate 24 via the substrate 24.

Figure 3:
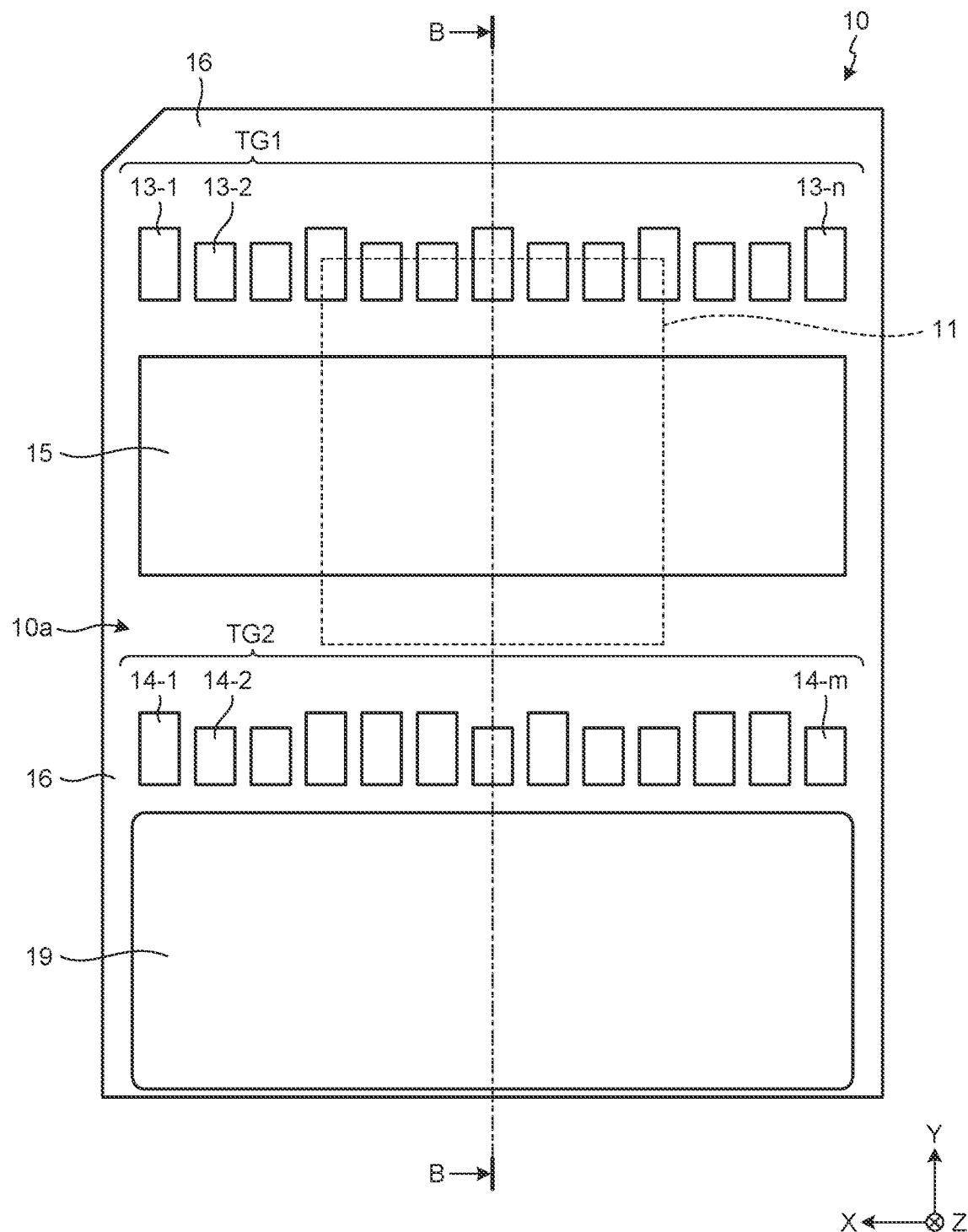
FIG. 3 is a plan view illustrating a configuration of the memory card according to the embodiment.
Figure 4:
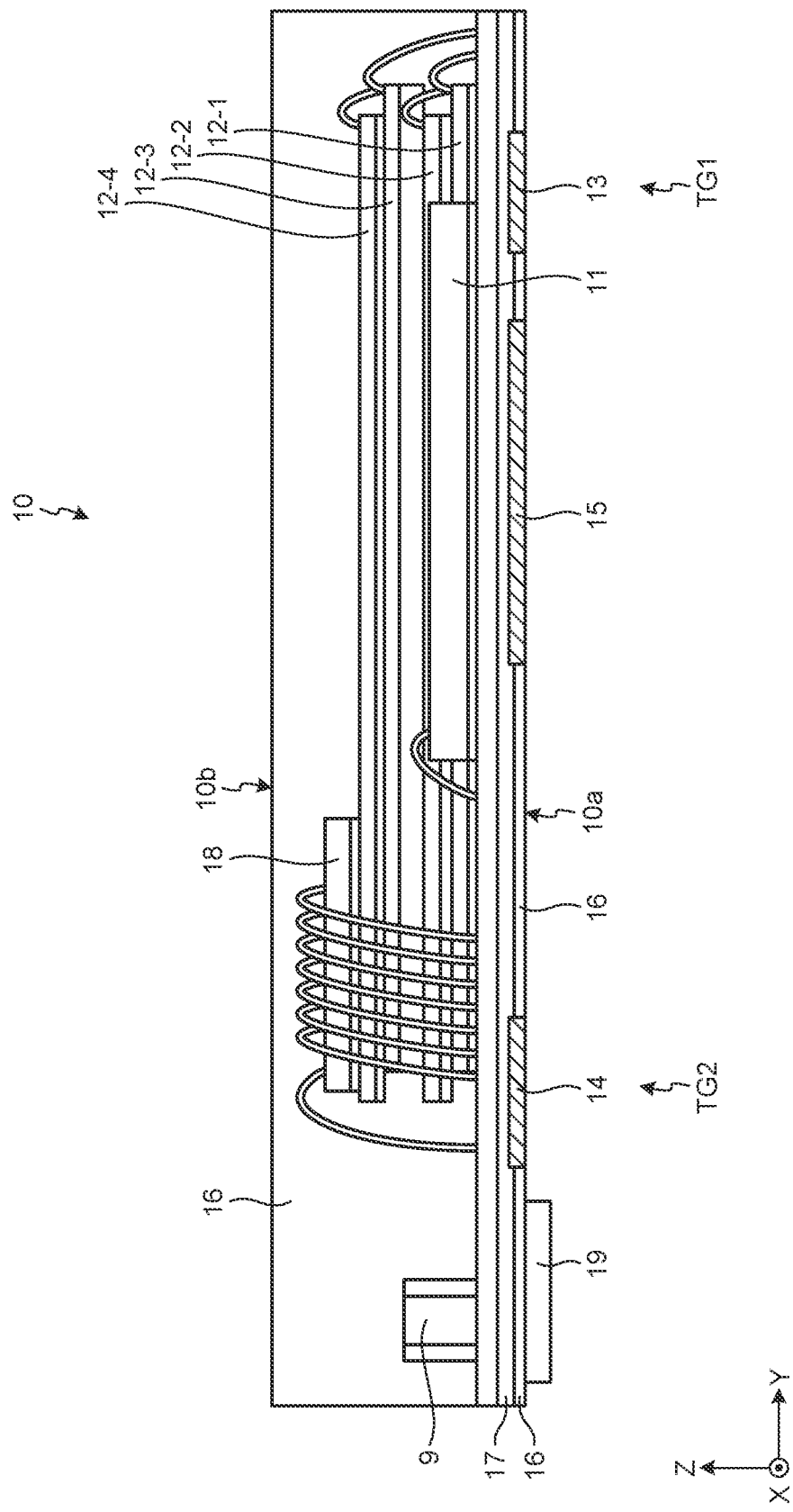
FIG. 4 is a cross-sectional view illustrating the configuration of the memory card according to the embodiment.

Specifically, as illustrated in FIGS. 3 and 4, the memory card 10 includes memory chips 12-1 to 12-4, the controller chip 11, a buffer chip 18, the conductive pattern 15, a sealing portion 16, a substrate 17, a terminal group TG1, a terminal group TG2, an electronic component 9, and a cover 19. FIG. 3 is a plan view illustrating a configuration of the memory card 10, and is a view of the memory card 10 as viewed from the −Z side (the side provided with the front surface 10*a*). FIG. 4 is a cross-sectional view illustrating the configuration of the memory card 10, and illustrates a cross section taken along the line B-B in FIG. 3.

On the surface of the substrate 17 on the +Z side, the plurality of memory chips 12-1 to 12-4 are stacked, and the controller chip 11 is arranged. The buffer chip 18 may further be stacked on the +Z side of the memory chip 12-4 provided furthest on the +Z side. On the surface of the substrate 17 on the −Z side, the terminal group TG-1 and the terminal group TG2 are arranged.

The sealing portion 16 covers the +Z side of the substrate 17 and houses the memory chips 12-1 to 12-4, the controller chip 11, the buffer chip 18, and the substrate 17. The sealing portion 16 may be made of a thermoplastic insulating material such as a mold resin. The sealing portion 16 covers the −Z side of the substrate 17 and exposes the terminal group TG1 and the terminal group 102. The surface of the sealing portion 16 on the −Z side forms the front surface 10*a* of the memory card 10, and the surface thereof on the +Z side forms a back surface lob of the memory card 10.

Each of the terminal group TG1 and the terminal group TG2 is arranged on the front surface 10*a* of the memory card 10. The terminal group TG1 and the terminal group TG2 are separated from each other in the Y direction inside the front surface 10*a*.

The terminal group TG1 includes a plurality of electrode terminals 13-1 to 13-*n*. Here, n is an integer of 2 or more. The plurality of electrode terminals 13-1 to 13-*n* are arranged in the X direction inside the front surface 10*a*. Each of the electrode terminals 13-1 to 13-*n* is formed substantially in a rectangular shape having a longitudinal direction thereof in the Y direction, for example. The electrode terminals 13-1 to 13-*n* have equal widths in the X direction and substantially equal widths in the Y direction. Each of the electrode terminals 13-1 13-*n* is made of a material containing a conductor (for example, a material containing at least one of copper, gold, sliver, aluminum, nickel, and the like) as a main component.

The terminal group TG2 includes a plurality of electrode terminals 14-1 to 14-*m*. Here, m is an integer of 2 or more. Here, m may be equal to or different from n. The plurality of electrode terminals 14-1 to 14-*m* are arranged in the X direction inside the front surface 10*a*. Each of the electrode terminals 14-1 to 14-*m* is formed substantially in a rectangular shape having a longitudinal direction thereof in the Y direction, for example. The electrode terminals 14-1 to 14-*m* have equal widths in the X direction and substantially equal widths in the Y direction. Each of the electrode terminals 14-1 to 14-*m* is made of a material containing a conductor (for example, a material containing at least one of copper, gold, silver, aluminum, nickel, and the like) as a main component.

The conductive pattern 15 is arranged on the front surface 10*a* of the memory card 10. The conductive pattern 15 is arranged between the terminal group TG1 and the terminal group TG2 in the Y direction inside the front surface 10*a*.

The conductive pattern 15 is a planar pattern and is also called a solid pattern. The conductive pattern 15 is arranged between the terminal group TG1 and the terminal group TG2 in the Y direction. The conductive pattern 15 may be formed in a rectangular shape in the XY planar view. The conductive pattern 15 preferably has a longer dimension than that of each of the electrode terminals 13 in the terminal group TG1, but is not limited thereto. For example, the width of the conductive pattern 15 in the X direction is larger than the width of each of the electrode terminals 13-1 to 13-*n* in the X direction. For example, the width of the conductive pattern 15 in the Y-direction is larger than the width of each of the electrode terminals 13-1 to 13-*n* in the Y-direction. For example, the conductive pattern 15 is made of a material containing a conductive material (for example, a material containing at least one of copper, gold, silver, aluminum, nickel, and the like) as a main component. The conductive pattern 15 is made of a material having higher heat conductivity than the resin constituting the sealing portion 16. Also, the conductive pattern 15 may be a non-conductor as long as the conductive pattern 15 has higher heat conductivity than the sealing portion 16.

The conductive pattern 15 is arranged at a position overlapping with the controller chip 11 on the front surface 10*a* when viewed in the Z direction. For example, the conductive pattern 15 includes therein the center of the controller chip 11 in the X and Y directions when viewed in the Z direction. For example, the width of the conductive pattern 15 in the X direction is larger than the width of the controller chip 11 in the X direction. The conductive pattern 15 is arranged so as to cross the controller chip 11 in the X direction when viewed in the Z direction. For example, the width of the conductive pattern 15 in the Y-direction is smaller than the width of the controller chip 11 in the Y-direction. The conductive pattern 15 is arranged so as to be crossed in the Y direction by the controller chip 11 when viewed in the Z direction. For example, when viewed in the Z direction, the end of the controller chip 11 on the −Y side may be located between the end of the conductive pattern 15 on the −Y side and the terminal group TG2. The conductive pattern 15 is more preferably arranged so as to overlap with the controller chip 11, but is not limited thereto.

The conductive pattern 15 may have a substantially equal dimension to that of the sealing portion 16. The width of the conductive pattern 15 in the X direction may be substantially equal to the width of the sealing portion 16 in the X direction, or may be a width obtained by subtracting dimensional margins on the +X side and the −X side from the width of the sealing portion 16 in the X direction. The width of the conductive pattern 15 in the Y direction is smaller than the space between the terminal group TG1 and the terminal group TG2 in the Y direction, and is, for example, about half the space. The distance between the end of the conductive pattern 15 on the −Y side and the terminal group TG2 is longer (for example, twice or more) than the distance between the end of the conductive pattern 15 in the +Y side and the terminal group TG1.

Returning to FIG. 1, the socket 20 includes a lid portion 21, a wall portion 22, a wall portion 23, the substrate 24, the plate-like member 25, a connection terminal group TG11, and a connection terminal group TG12.

The substrate 24 is a plate-like member extending in the X and Y directions. The substrate 24 is made of, for example, an insulating resin.

The wall portion 22 and the wall portion 23 are arranged on a front surface 24*a* of the substrate 24, respectively. The wall portion 22 and the wall portion 23 are formed in two substantially lateral U-shapes the opening portions of which are opposed to each other in the XY planar view. The wall portion 22 and the wall portion 23 form the recessed space 20a. The width of the recessed space 20a in the X direction is substantially equal to the width of the memory card 10 in the X direction, and the width thereof in the Y direction is substantially equal to the width of the memory card 10 in the Y direction.

The plate-like member 25 is arranged on the front surface 24a of the substrate 24 and is located in the recessed space 20a. For example, the plate-like member 25 is arranged between the connection terminal group TG11 and the connection terminal group TG12 in the Y direction. The plate-like member 25 is arranged at a position where the plate-like member 25 can come into contact with the conductive pattern 15 of the memory card 10. The plate-like member 25 may be formed in a rectangular shape in the XY planar view. For example, the width of the plate-like member 25 in the X direction is equal to the width of the conductive pattern 15 in the X direction, for example. For example, the width of the plate-like member 25 in the Y direction is smaller than the space between the connection terminal group TG11 and the connection terminal group TG12 in the Y direction. For example, the width of the plate-like member 25 in the Y direction is equal to the width of the conductive pattern 15 in the Y direction, for example.

The plate-like member 25 is made of a material having heat conductivity (TIM: Termal Interface Material). The plate-like member 25 may be a heat conductive sheet, a heat conductive grease member, a heat conductive adhesive member, a heat conductive putty member, a phase change member, or a solder member. The heat conductive sheet is a sheet-like member made of a resin filled with a filler having heat conductivity. The heat conductive grease member is a member in which a viscous liquid obtained by adding heat conductive particles such as metal powder to a resin such as silicone is dried and solidified into a plate shape. The heat conductive adhesive member is a member in which an adhesive having heat conductivity is dried and solidified into a plate shape. The heat conductive putty member is a member in which a high-viscosity liquid material having heat conductivity is dried and solidified into a plate shape. The phase change member is a member obtained by liquefying a phase change material containing a heat conductive resin as a main component and then solidifying the phase change material into a plate shape. The solder member is a member in which a solder alloy is melted and then solidified into a plate shape.

The connection terminal group TG11 is arranged on the inside surface of the wall portion 23 on the −Y side and is located in the recessed space 20a. The connection terminal group TG11 includes a plurality of connection terminals 26-1 to 26-n. The plurality of connection terminals 26-1 to 26-n. are arranged at positions where the connection terminals can come into contact with the plurality of electrode terminals 13-1 to 13-n of the terminal group TG1 in the memory card 10. Each of the connection terminals 26-1 to 26-n protrudes to the −Y side and the +Z side from the inside surface of the wall portion 23 on the −Y side toward a position where the connection terminal can come into contact with the electrode terminal 13 when the memory card 10 is attached.

The connection terminal group TG12 is arranged on the inside surface of the wall portion 22 on the +Y side and is located in the recessed space 20a. The connection terminal group TG12 includes a plurality of connection terminals 27-1 to 27-m. The plurality of connection terminals 27-1 to 27-m are arranged at positions where the connection terminals can come into contact with the plurality of electrode terminals 14-1 to 14-m of the terminal group TG2 in the memory card 10. Each of the connection terminals 27-1 to 27-m protrudes to the +Y side and the +Z side from the inside surface of the wall portion 22 on the +Y side toward a position where the connection terminal can come into contact with the electrode terminal 14 when the memory card 10 is attached.

The lid portion 21 is rotatably attached to both ends in the X direction on the −Y side of the wall portion 22. As illustrated in FIG. 2A, the lid portion 21 opens the recessed space 20a in a state of being pulled up to the +Z side and opened. In this state, the memory card 10 is fitted into the recessed space 20a, and the memory card 10 is attached to the socket 20. As illustrated in FIG. 2B, the lid portion 21 closes the recessed space 20a in a state of being pulled down to the −Z side and closed. In this state, the memory card 10 is housed in the socket 20, and attachment of the memory card 10 to the socket 20 is completed.

The lid portion 21 can press the memory card 10 toward the −Z side by its own weight or by fitting into a predetermined fitting portion of the wall portion 22 or the wall portion 23 in a closed state. Accordingly, as illustrated in FIG. 2B, the electrode terminals 13 of the terminal group TG1 on the front surface 10a of the memory card 10 come into contact with the connection terminals 26 of the connection terminal group TG11. The electrode terminals 14 of the terminal group TG2 on the front surface 10a of the memory card 10 come into contact with the connection terminal 27 of the connection terminal group TG12.

As a result, the memory card 10 can communicate with the host via the terminal group TG1 and the connection terminal group TG11 and/or via the terminal group TG2 and the connection terminal group TG12 to perform operations such as reading and writing data from and into the memory chip. In the memory card 10, the controller chip 11 can generate heat during this operation.

At this time, the conductive pattern 15 on the front surface 10a of the memory card 10 comes into contact with the plate-like member 25. As a result, as indicated by the arrows of the alternate long and short dash lines in FIG. 2B, heat generated in the controller chip 11 in the memory card 10 can efficiently be dissipated via the conductive pattern 15 and the plate-like member 25.

As described above, in the present embodiment, in the memory system 1, the front surface 10a of the memory card 10 has the planar conductive pattern 15 at a position overlapping with the controller chip 11 when viewed in the Z direction. Also, the socket 20 has a heat conductive plate-like member 25 at a position that can come into contact with the conductive pattern 15. The conductive pattern 15 comes into contact with the plate-like member 25 in a state where the memory card 10 is attached to the socket 20. As a result, heat generated in the controller chip 11 in the memory card 10 can efficiently be dissipated via the conductive pattern 15 and the plate-like member 25.

Note that the memory card 10 may have a configuration in which the conductive pattern 15 is omitted. Even in this case, in the memory system 1, as illustrated in FIGS. 2A and 2B, the heat conductive plate-like member 25 comes into contact with the memory card 10 when the memory card 10 is attached to the socket 20. Therefore, when the controller chip 11 in the memory card 10 generates heat, the heat can efficiently be dissipated.

Figure 5:
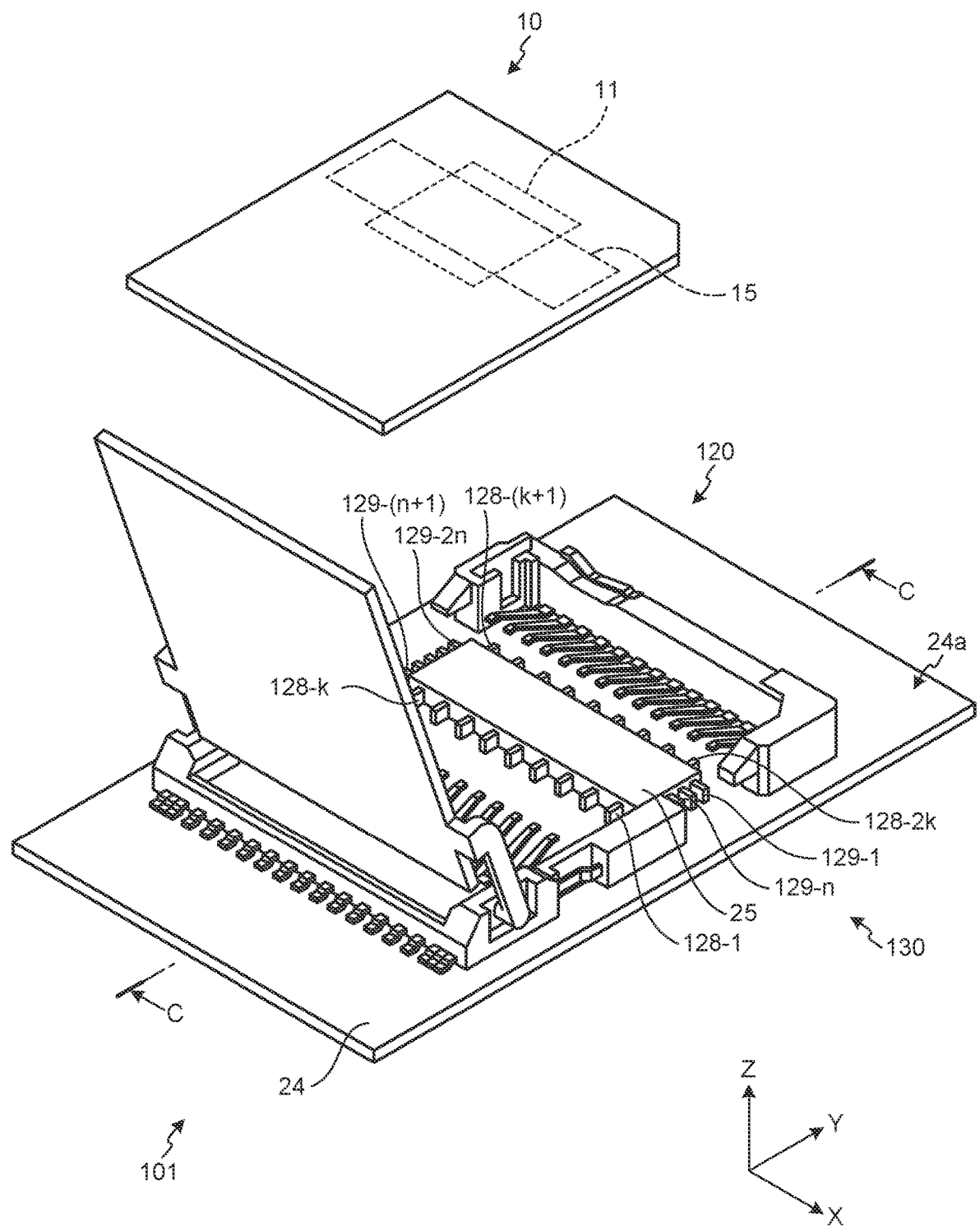
FIG. 5 is a perspective view illustrating a configuration of a memory system according to a first modification example of the embodiment.

Also, as a first modification example of the embodiment, a socket 120 of a memory system 101 may further include a heat dissipation structure 130 as illustrated in FIG. 5. FIG. 5 is a perspective view illustrating a configuration of the memory system 101 according to the first modification example of the embodiment. The heat dissipation structure 130 comes into contact with the plate-like member 25. The heat dissipation structure 130 has a structure suitable for heat dissipation, and includes, for example, a plurality of fins 128-1 to 128-$k$ and 128-($k$+1) to 128-2$k$ and a plurality of fins 129-1 to 129-$n$ and 129-($n$+1) to 129-2$n$.

For example, the fins 128-1 to 128-$k$ are arranged on the side surface of the plate-like member 25 on the −Y side and are arrayed in the X direction while being separated from each other. Each of the fins 128-1 to 128-$k$ extends in a plate shape in the Y and Z directions. Each of the fins 128-1 to 128-$k$ comes into contact with the side surface of the plate-like member 25 on the −Y side and protrudes in the −Y direction from the side surface of the plate-like member 25 on the −Y side. The end of each of the fins 128-1 to 128-$k$ on the −Z side may come into contact with the front surface 24$a$ of the substrate 24.

For example, the fins 128-($k$+1) to 128-2$k$ are arranged on the side surface of the plate-like member 25 on the +Y side and are arrayed in the X direction while being separated from each other. Each of the fins 128-($k$+1) to 128-2$k$ extends in a plate shape in the Y and Z directions. Each of the fins 128-($k$+1) to 128-2$k$ comes into contact with the side surface of the plate-like member 25 on the +Y side and protrudes in the +Y direction from the side surface of the plate-like member 25 on the +Y side. The end of each of the fins 128-($k$+1) to 128-2$k$ on the −Z side may come into contact with the front surface 24$a$ of the substrate 24.

For example, the fins 129-1 to 129-$n$ are arranged on the side surface of the plate-like member 25 on the +X side and are arrayed in the Y direction while being separated from each other. Each of the fins 129-1 to 129-$n$ extends in a plate shape in the X and Z directions. Each of the fins 129-1 to 129-$n$ comes into contact with the side surface of the plate-like member 25 on the +X side and protrudes in the +X direction from the side surface of the plate-like member 25 on the +X side. The end of each of the fins 129-1 to 129-$n$ on the −Z side may come into contact with the front surface 24$a$ of the substrate 24.

For example, the fins 129-($n$+1) to 129-2$n$ are arranged on the side surface of the plate-like member 25 on the −X side and are arrayed in the Y direction while being separated from each other. Each of the fins 129-($n$+1) to 129-2$n$ extends in a plate shape in the X and Z directions. Each of the fins 129-($n$+1) to 129-2$n$ comes into contact with the side surface of the plate-like member 25 on the −X side and protrudes in the −X direction from the side surface of the plate-like member 25 on the −X side. The end of each of the fins 129-($n$+1) to 129-2$n$ on the −Z side may come into contact with the front surface 24$a$ of the substrate 24.

Figure 6A:
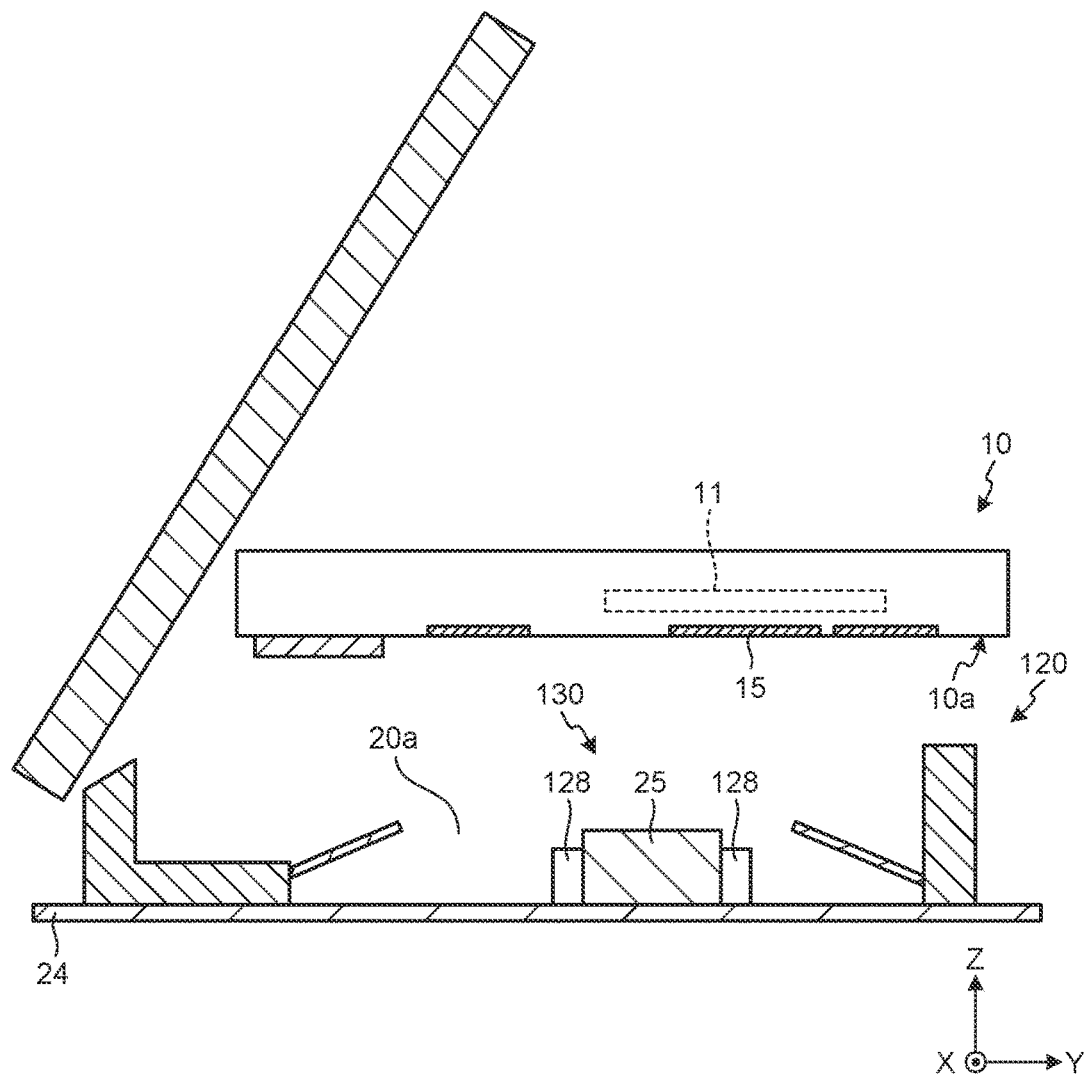
FIGS. 6A and 6B are cross-sectional views illustrating heat dissipation of the memory card according to the first modification example of the embodiment.
Figure 6B:
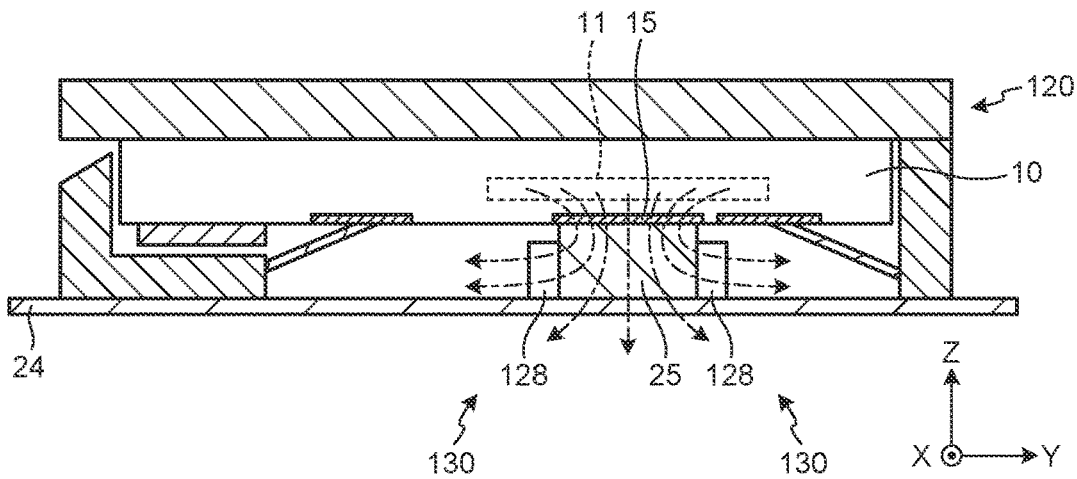

As illustrated in FIGS. 6A and 6B, the memory card 10 can be attached to the socket 120 by being fitted into the recessed space 20$a$ with the front surface 10$a$ facing the socket 120. FIGS. 6A and 6B are diagrams illustrating attachment and heat dissipation of the memory card 10 according to the first modification example of the embodiment. Each of FIGS. 6A and 6B corresponds to a cross section taken along the line C-C in FIG. 5. FIG. 6A illustrates a state before the memory card 10 is attached, and FIG. 6B illustrates a state in which the memory card 10 has been attached.

When the memory card 10 is operated in a state of being attached to the socket 120, the controller chip 11 can generate heat. To deal with this, the front surface 10$a$ of the memory card 10 has a planar conductive pattern 15 at a position overlapping with the controller chip 11 when viewed in the Z direction. Also, the socket 120 has the heat conductive plate-like member 25 at a position that can come into contact with the conductive pattern 15 and further has the heat dissipation structure 130. The conductive pattern 15 comes into contact with the plate-like member 25 in a state where the memory card 10 is attached to the socket 120. As a result, as indicated by the alternate long and short dash lines in FIG. 6B, heat generated in the controller chip 11 in the memory card 10 can efficiently be dissipated via the conductive pattern 15, the plate-like member 25, and the heat dissipation structure 130. That is, as heat radiation paths, a path of the controller chip 11→the conductive pattern 15→the plate-like member 25→the heat dissipation structure 130→"the gases around the heat dissipation structure 130" is added to a path of the controller chip 11→the conductive pattern 15→the plate-like member 25→the substrate 24→the gases around the substrate 24. Accordingly, the heat dissipation efficiency can be improved.

Figure 7:
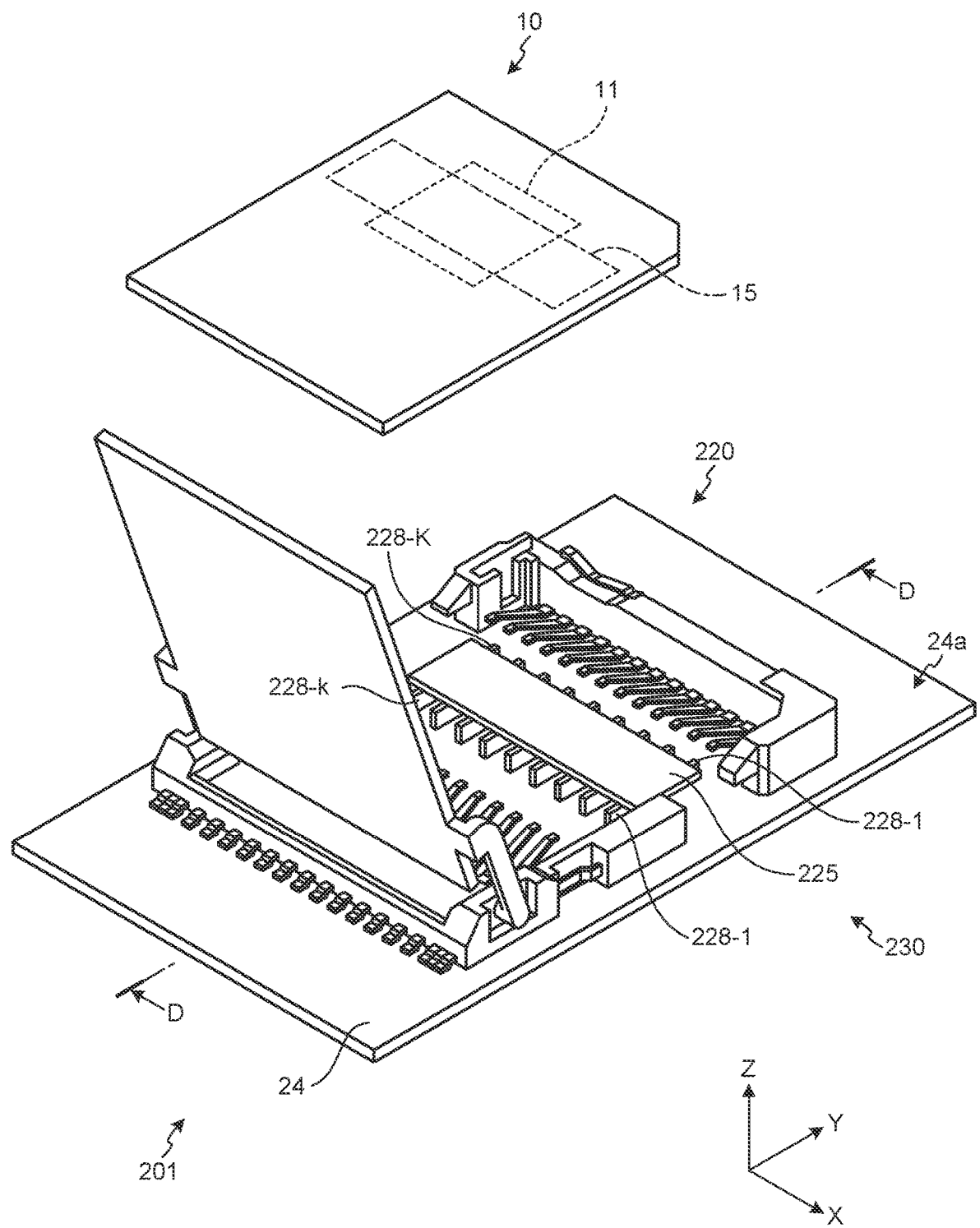
FIG. 7 is a perspective view illustrating a configuration of a memory system according to a second modification example of the embodiment.

Also, as a second modification example of the embodiment, a socket 220 of a memory system 201 may include a thin plate-like member 225 instead of the plate-like member 25 (refer to FIG. 1) and further include a heat dissipation structure 230 as illustrated in FIG. 7. FIG. 7 is a perspective view illustrating a configuration of the memory system 201 according to the second modification example of the embodiment. The heat dissipation structure 230 may be arranged between the plate-like member 225 and the substrate 24 in the Z direction and may come into contact with each of the plate-like member 225 and the substrate 24. The heat dissipation structure 230 has a structure suitable for heat dissipation, and includes, for example, a plurality of fins 228-1 to 228-$k$.

The plate-like member 225 may be thinned to such an extent that the sum of the thickness of the plate-like member 225 and the width of each fin 228 in the Z direction is substantially equal to the thickness of the plate-like member 25. The plate-like member 225 may be a heat conductive sheet thinned by means of polishing or the like, a heat conductive grease member thinned by means of polishing or the like, a heat conductive adhesive member thinned by means of polishing or the like, a heat conductive putty member thinned by means of polishing or the like, a phase change member thinned by means of polishing or the like, or a solder member thinned by means of polishing or the like.

The fins 228-1 to 228-$k$ are arranged in the X direction while being separated from each other. Each of the fins 228-1 to 228-$k$ extends in a plate shape in the Y and Z directions. Each of the fins 228-1 to 228-$k$ protrudes in the −Y direction from the side surface of the plate-like member 225 on the −Y side and protrudes in the +Y direction from the side surface of the plate-like member 225 on the +Y side in the XY planar view. The end of each of the fins 228-1 to 228-$k$ on the +Z side may come into contact with the surface of the plate-like member 225 on the −Z side, and the end thereof on the −Z side may come into contact with the front surface 24$a$ of the substrate 24.

Figure 8A:
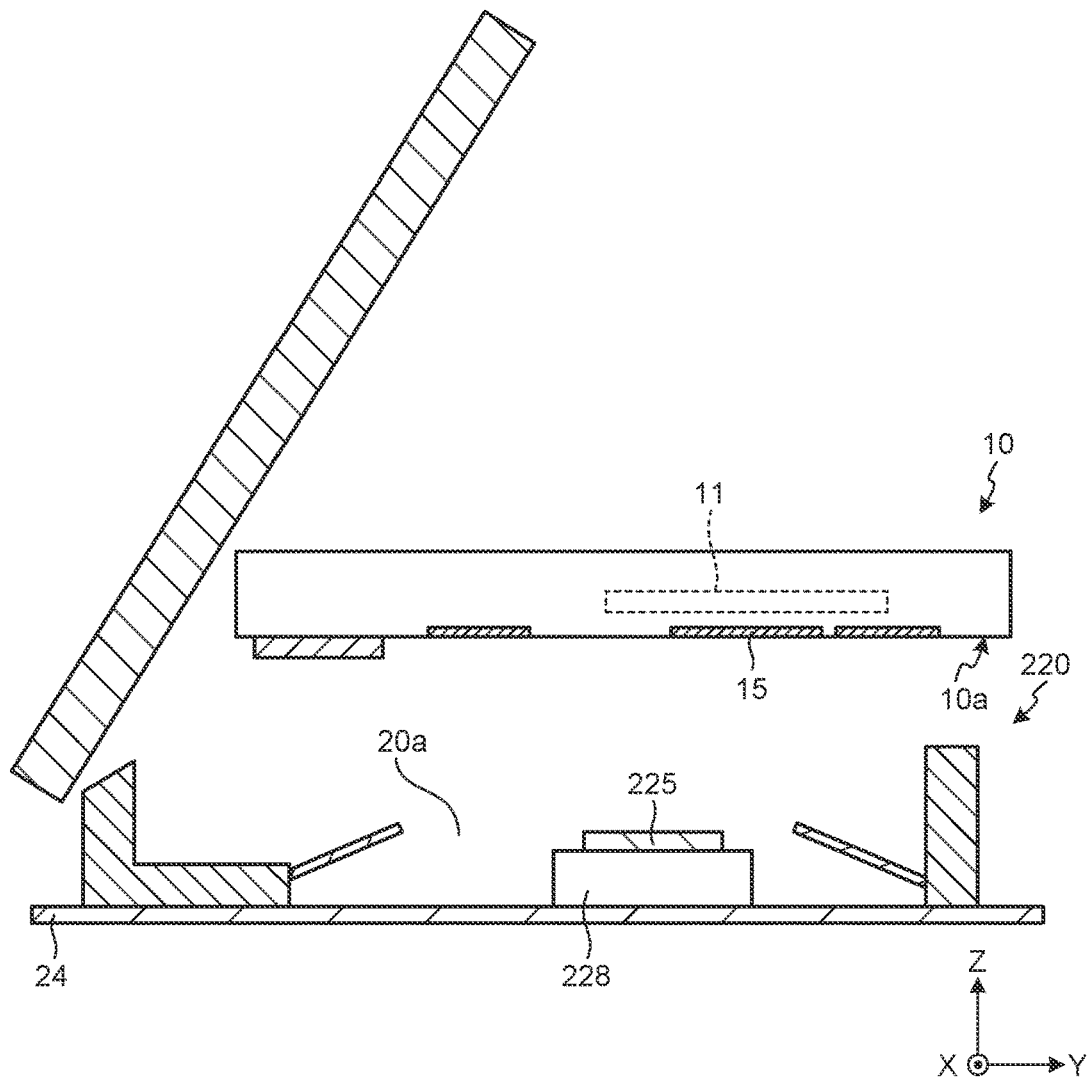
FIGS. 8A and 8B are cross-sectional views illustrating heat dissipation of the memory card according to the second modification example of the embodiment.
Figure 8B:
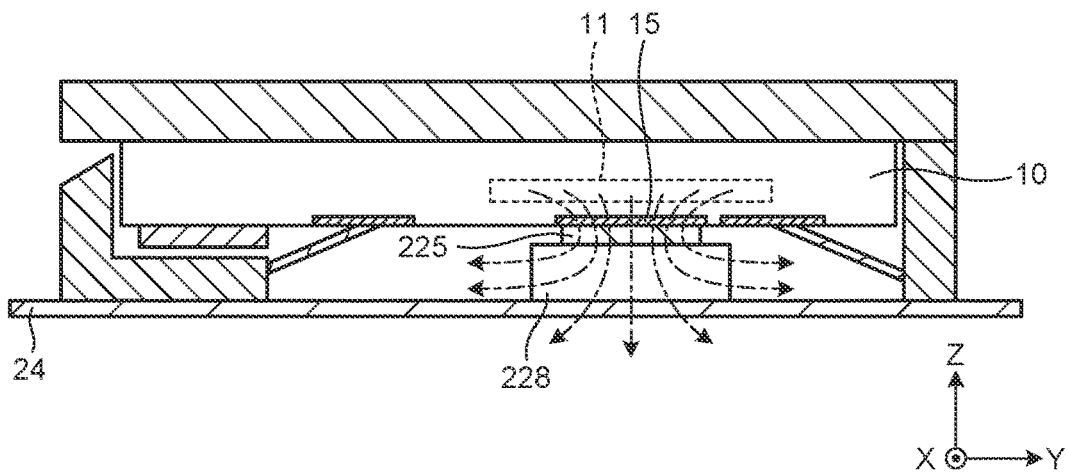

As illustrated in FIGS. 8A and 8B, the memory card 10 can be attached to the socket 220 by being fitted into the recessed space 20$a$ with the front surface 10$a$ facing the socket 220. FIGS. 8A and 8B illustrate attachment and heat dissipation of the memory card 10 according to the second modification example of the embodiment. Each of FIGS. 8A and 8B corresponds to a cross section taken along the line D-D in FIG. 7. FIG. 8A illustrates a state before the memory card 10 is attached, and FIG. 8B illustrates a state in which the memory card 10 has been attached.

When the memory card 10 is operated in a state of being attached to the socket 220, the controller chip 11 can generate heat. To deal with this, the front surface 10a of the memory card 10 has a planar conductive pattern 15 at a position overlapping with the controller chip 11 when viewed in the Z direction. Also, the socket 220 has the heat conductive plate-like member 225 at a position that can come into contact with the conductive pattern 15 and further has the heat dissipation structure 230. The conductive pattern 15 comes into contact with the plate-like member 225 in a state where the memory card 10 is attached to the socket 220. As a result, as indicated by the alternate long and short dash lines in FIG. 8B, heat generated in the controller chip 11 in the memory card 10 can efficiently be dissipated via the conductive pattern 15, the plate-like member 225, and the heat dissipation structure 230. That is, as heat radiation paths, a path of the controller chip 11→the conductive pattern 15→the plate-like member 225→the heat dissipation structure 230→"the gases around the heat dissipation structure 230" is added to a path of the controller chip 11→the conductive pattern 15→the plate-like member 225→the heat dissipation structure 230→the substrate 24→"the gases around the substrate 24". Accordingly, the heat dissipation efficiency can be improved.

Figure 9:
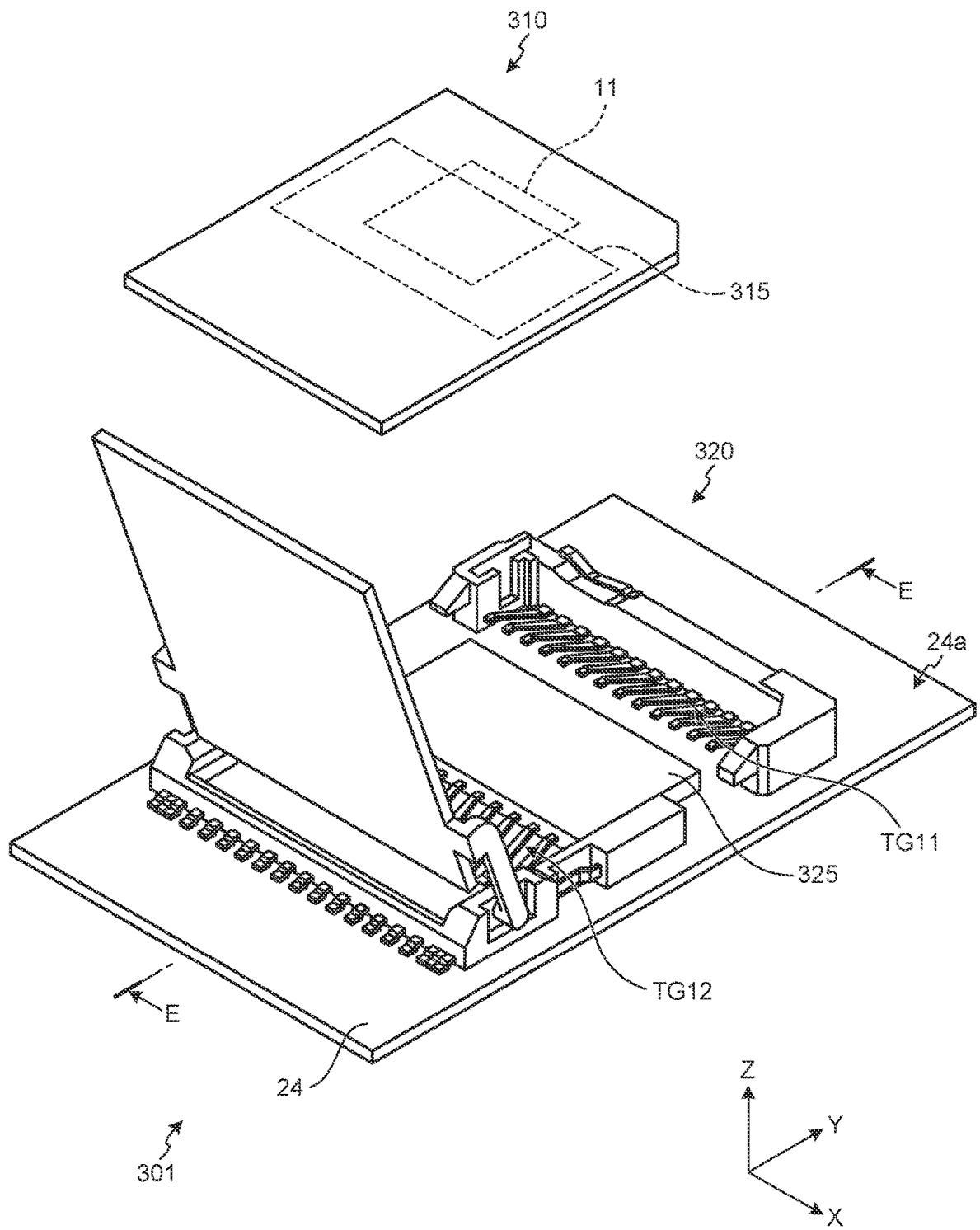
FIG. 9 is a perspective view illustrating a configuration of a memory system according to a third modification example of the embodiment.
Figure 10:
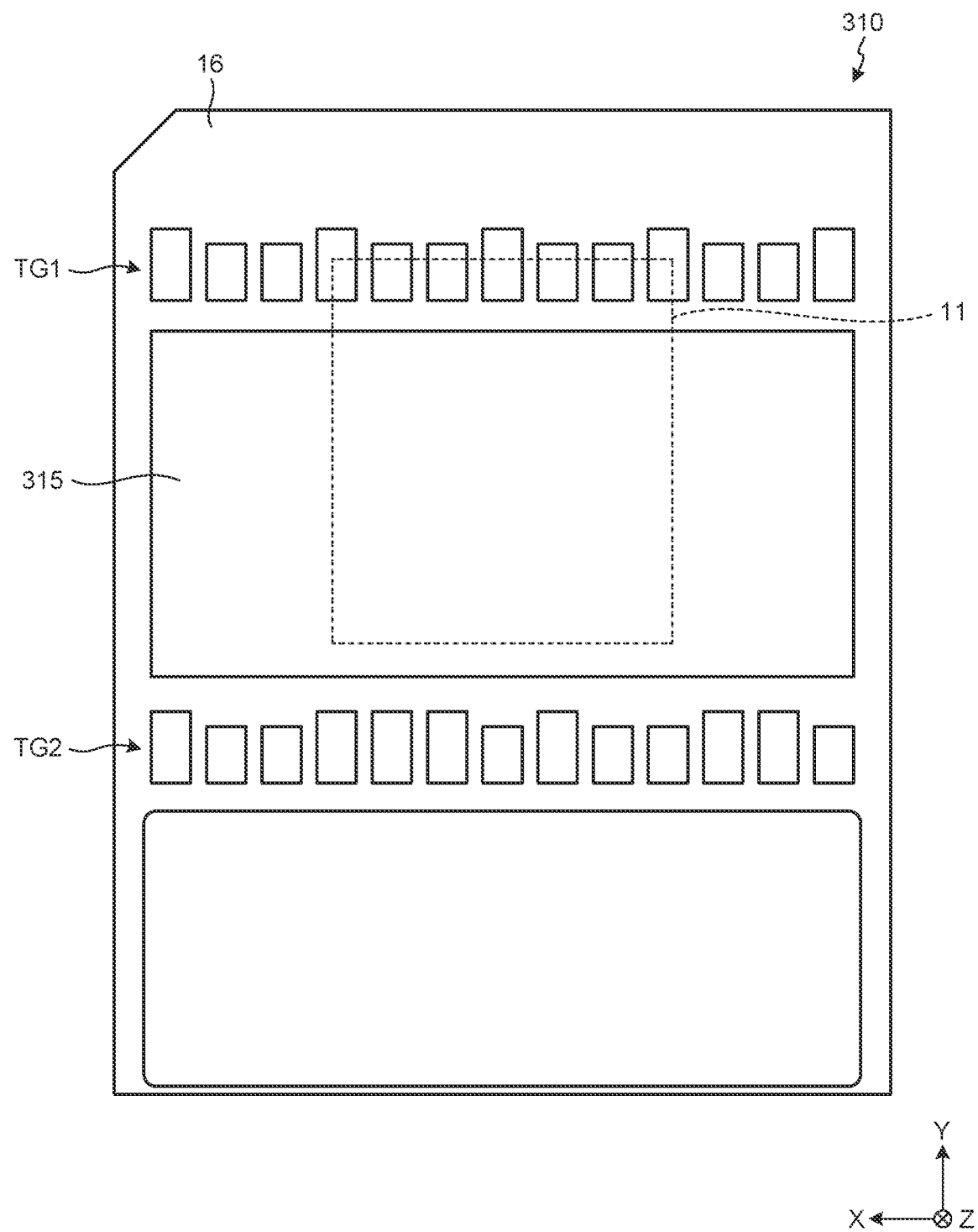
FIG. 10 is a plan view illustrating a configuration of a memory card according to the third modification example of the embodiment.

Further, as a third modification example of the embodiment, as illustrated in FIGS. 9 and 10, a conductive pattern 315 of a memory card 310 of a memory system 301 and a plate-like member 325 of a socket 320 may be widened in the Y direction within the possible range. FIG. 9 is a perspective view illustrating a configuration of the memory system 301 according to the third modification example of the embodiment. FIG. 10 is a plan view illustrating a configuration of the memory card 310 according to the third modification example of the embodiment.

As illustrated in FIG. 10, when viewed in the Z direction, the width of the conductive pattern 315 in the Y direction may be substantially equal to the width of the controller chip 11 in the Y direction. The end of the conductive pattern 315 on the −Y side may be located between the end of the controller chip 11 on the −Y side and the terminal group TG2. Accordingly, the area of the region where the conductive pattern 315 and the controller chip 11 overlap with each other is larger than the area of the region where the conductive pattern 315 and the controller chip 11 overlap with each other (refer to FIG. 3).

The width of the conductive pattern 315 in the Y-direction is substantially equal to the space between the terminal group TG1 and the terminal group TG2 in the Y-direction. For example, the width of the conductive pattern 315 in the Y direction is larger than half of the space between the terminal group TG1 and the terminal group TG2 in the Y direction. For example, the distance between the end of the conductive pattern 315 on the −Y side and the terminal group TG2 is as short as the distance between the end of the conductive pattern 315 in the +Y side and the terminal group TG1.

The plate-like member 325 can come into contact with the conductive pattern 315 of the memory card 310. For example, the width of the plate-like member 325 in the X direction is equal to the width of the conductive pattern 315 in the X direction, for example. For example, the width of the plate-like member 325 in the Y direction is smaller than the space between the connection terminal group TG11 and the connection terminal group TG12 in the Y direction. For example, the width of the plate-like member 325 in the Y direction is equal to the width of the conductive pattern 315 in the Y direction, for example.

Figure 11A:
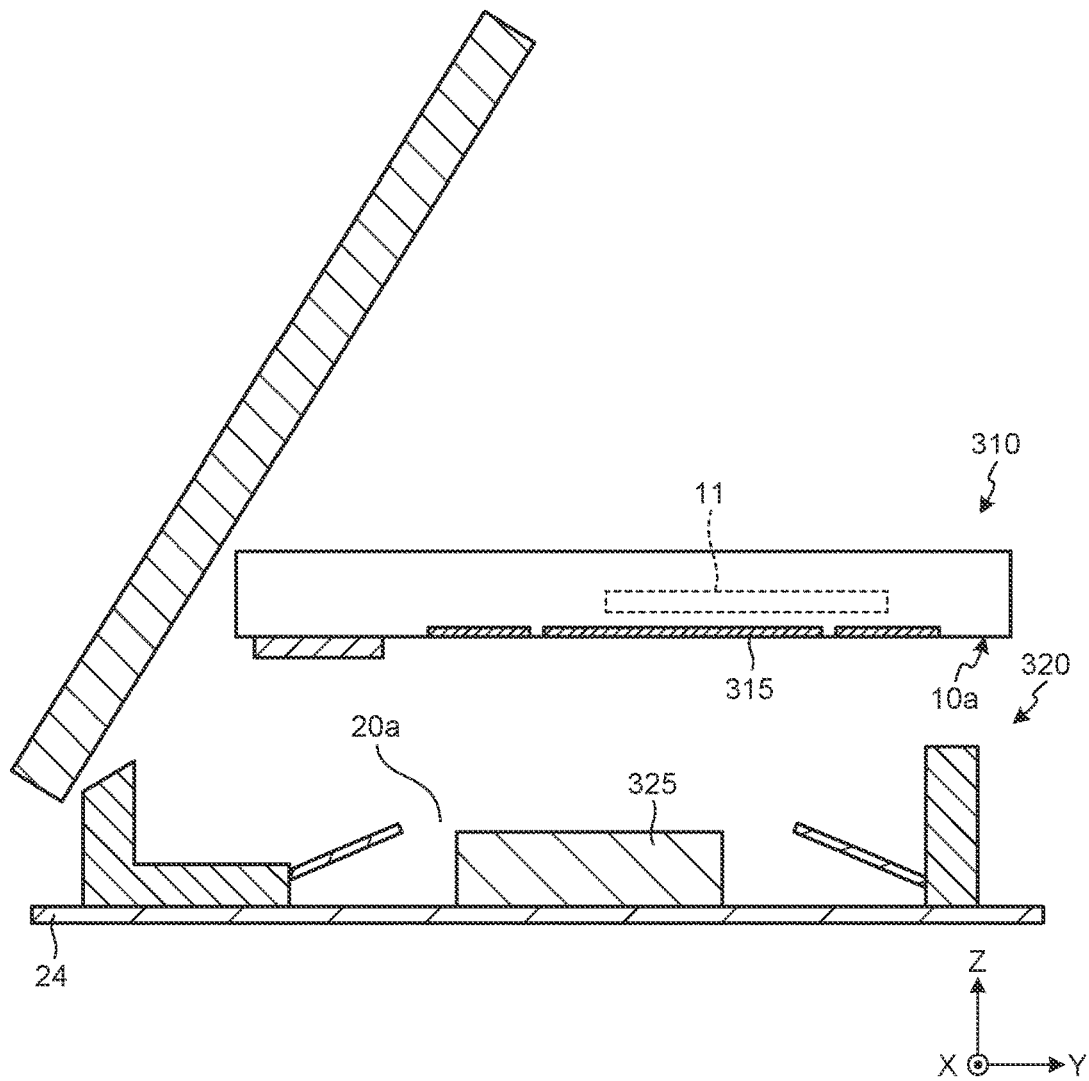
FIGS. 11A and 11B are cross-sectional views illustrating heat dissipation of the memory card according to the third modification example of the embodiment.
Figure 11B:
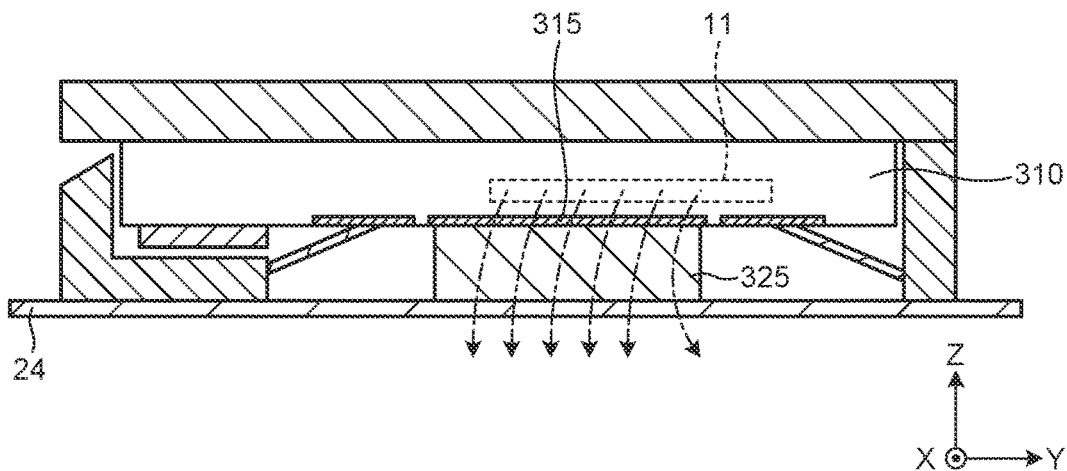

As illustrated in FIGS. 11A and 11B, the memory card 310 can be attached to the socket 320 by being fitted into the recessed space 20a with the front surface 10a facing the socket 320. FIGS. 11A and 11B are diagrams illustrating heat dissipation of the memory card 310 according to the third modification example of the embodiment. Each of FIGS. 11A and 11B corresponds to a cross section taken along the line E-E in FIG. 9. FIG. 11A illustrates a state before the memory card 310 is attached, and FIG. 11B illustrates a state in which the memory card 310 has been attached.

When the memory card 310 is operated in a state of being attached to the socket 320, the controller chip 11 can generate heat. To deal with this, the front surface 10a of the memory card 310 has the planar conductive pattern 315 at a position overlapping with the controller chip 11 when viewed in the Z direction. Also, the socket 320 has the heat conductive plate-like member 325 at a position that can come into contact with the conductive pattern 315. The conductive pattern 315 comes into contact with the plate-like member 325 in a state where the memory card 310 is attached to the socket 320. Each of the conductive pattern 315 and the plate-like member 325 is widened in the Y direction within the possible range. As a result, the contact area between the conductive pattern 315 and the plate-like member 325 is larger than the contact area between the conductive pattern 15 and the plate-like member 25 (refer to FIG. 2B). As a result, as indicated by the arrows of the alternate long and short dash lines in FIG. 11E, heat generated in the controller chip 11 in the memory card 310 can efficiently be dissipated via the conductive pattern 315 and the plate-like member 325. That is, the heat radiation path may have a smaller curvature and a shorter distance. Accordingly, the heat dissipation efficiency can be improved.

Figure 12:
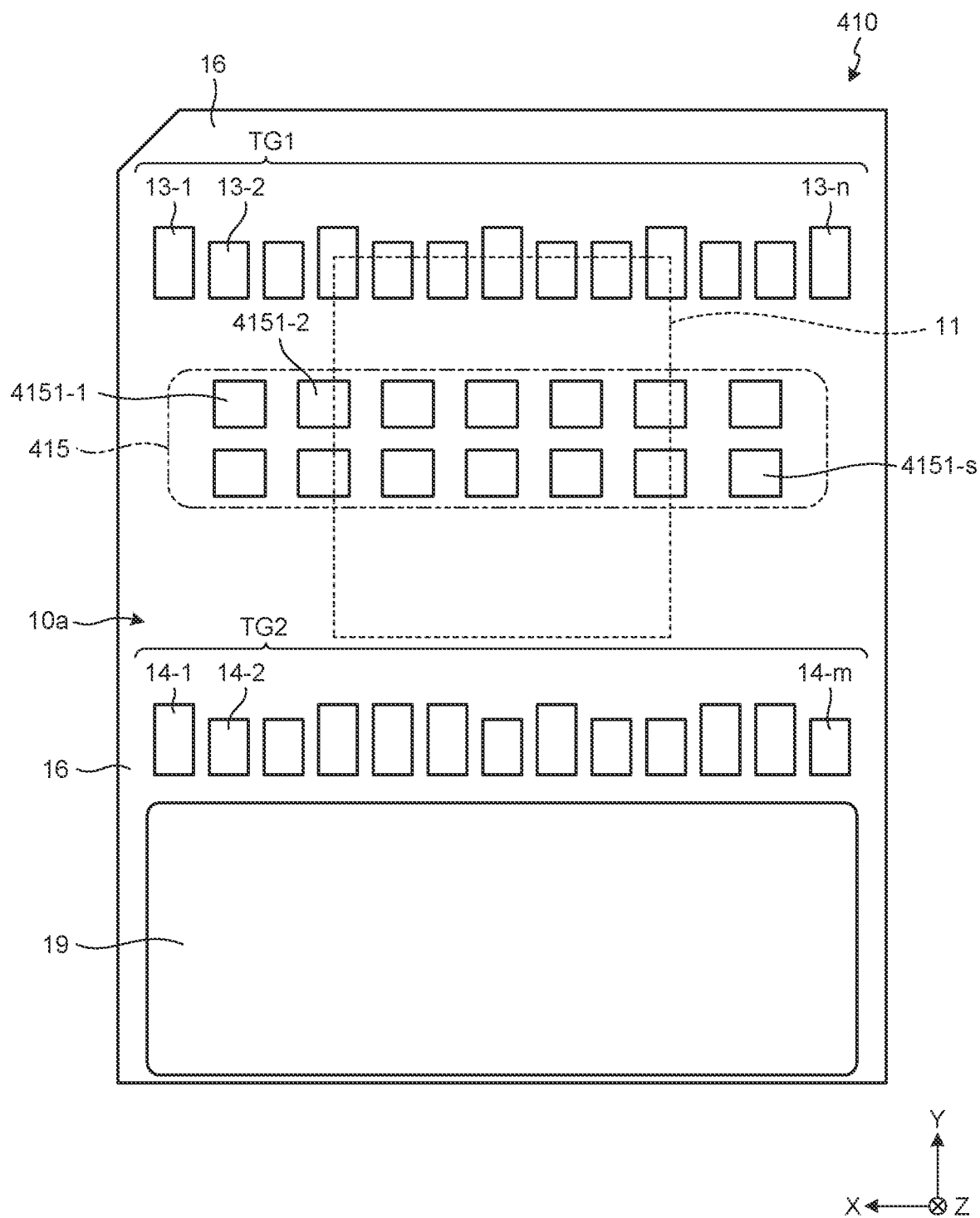
FIG. 12 is a diagram illustrating a configuration of a memory card according to another embodiment.

Another Embodiment (a) In the above embodiment, the solid conductive patterns 15 and 315 are exemplified, but instead of these patterns, a predetermined terminal group may be used. For example, a memory card 410 may be provided with a test terminal group used for a test before shipment and/or a test after shipment. The test terminal group includes a plurality of pad electrodes. Since each of the pad electrodes is made of a conductor, the test terminal group may be used for heat dissipation. For example, as illustrated in FIG. 12, a plurality of pad electrodes 4151-1 to 4151-$s$ (where s is any integer of 2 or more) used in a product test or the like for the memory card 410 can be regarded as a conductive pattern 415 for heat dissipation. FIG. 12 is a diagram illustrating a configuration of the memory card 410 according to another embodiment. At this time, each of the pad electrodes 4151 for tests may be electrically connected to the controller chip 11 inside. Therefore, the heat of the controller chip 11 can more efficiently be dissipated to the outside. The number, positions, and sizes of the pad electrodes in FIG. 12 are illustrative, and are not necessarily selected.

While certain embodiments have been described, these embodiments have been presented by way of example only, and are riot intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying

What is claimed is:

1. A memory card comprising:
a memory chip;
a controller chip;
a sealing portion that houses the memory chip and the controller chip and that includes a first main surface and a second main surface arranged on an opposite side of the first main surface;
a first terminal group that includes a plurality of electrode terminals arranged in a first direction inside the first main surface;
a second terminal group that includes a plurality of electrode terminals arranged in the first direction inside the first main surface; and
a conductive pattern that is arranged between the first terminal group and the second terminal group in the first main surface, that has a longer dimension than a dimension of the electrode terminal in the first terminal group, that has a longer dimension than a dimension of the electrode terminal in the second terminal group, and that has a planar shape,
wherein:
the conductive pattern is arranged at a region overlapping with the controller chip when viewed in a third direction perpendicular to the first main surface,
the conductive pattern is arranged so as to cross the controller chip in the first direction when viewed in the third direction, and
the conductive pattern is arranged so as to be crossed in a second direction by the controller chip when viewed in the third direction, the second direction being a direction perpendicular to the first direction in a planar view.

2. The memory card according to claim 1, wherein a width of the conductive pattern in the first direction is larger than a width of the electrode terminal in the first terminal group in the first direction and is larger than a width of the electrode terminal in the second terminal group in the first direction.

3. The memory card according to claim 2, wherein:
the width of the conductive pattern in the first direction is larger than a width of the conductive pattern in the second direction,
the width of the electrode terminal in the first terminal group in the first direction is smaller than a width of the electrode terminal in the first terminal group in the second direction, and
the width of the electrode terminal in the second terminal group in the first direction is smaller than a width of the electrode terminal in the second terminal group in the second direction.

4. The memory card according to claim 2, wherein the width of the conductive pattern in the first direction is substantially equal to a width of the sealing portion in the first direction.

5. The memory card according to claim 2, wherein a width of the conductive pattern in the second direction is larger than a width of the electrode terminal in the first terminal group in the second direction and is larger than a width of the electrode terminal in the second terminal group in the second direction.

6. The memory card according to claim 5, wherein:
the width of the conductive pattern in the first direction is larger than the width of the conductive pattern in the second direction,
the width of the electrode terminal in the first terminal group in the first direction is smaller than the width of the electrode terminal in the first terminal group in the second direction, and
the width of the electrode terminal in the second terminal group in the first direction is smaller than the width of the electrode terminal in the second terminal group in the second direction.

7. The memory card according to claim 1, wherein a width of the conductive pattern in the first direction is larger than a width of the controller chip in the first direction.

8. The memory card according to claim 7, wherein a width of the conductive pattern in the second direction is larger than a width of the controller chip in the second direction.

9. A memory system comprising:
a memory card; and
a socket to which the memory card is attachable,
wherein the memory card includes:
a memory chip;
a controller chip;
a case that houses the memory chip and the controller chip and that includes a first main surface and a second main surface arranged on an opposite side of the first main surface;
a first terminal group that includes a plurality of electrode terminals arranged in a first direction inside the first main surface; and
a second terminal group that includes a plurality of electrode terminals arranged in the first direction inside the first main surface, and
the socket includes:
a first connection terminal group that includes a plurality of connection terminals configured to come into contact with the electrode terminals in the first terminal group, respectively;
a second connection terminal group that includes a plurality of connection terminals configured to come into contact with the electrode terminals in the second terminal group, respectively; and
a plate-like member that is arranged between the first connection terminal group and the second connection terminal group and that is heat conductive.

10. The memory system according to claim 9, wherein:
the memory card further includes a conductive pattern that is arranged between the first terminal group and the second terminal group in the first main surface, that has a longer dimension than a dimension of the electrode terminal in the first terminal group, that has a longer dimension than a dimension of the electrode terminal in the second terminal group, and that has a planar shape, and
the plate-like member is configured to come into contact with the conductive pattern.

11. The memory system according to claim 10, wherein the conductive pattern comes into contact with the plate-like member in a state where the memory card is attached to the socket.

12. The memory system according to claim 10, wherein the planar shape of the conductive pattern is substantially equal to a planar shape of the plate-like member.

13. The memory system according to claim 10, wherein a width of the conductive pattern in the first direction is substantially equal to a width of the plate-like member in the first direction.

14. The memory system according to claim 10, wherein a width of the conductive pattern in a second direction perpendicular to the first direction in a planar view is substantially equal to a width of the plate-like member in the second direction.

15. The memory system according to claim 9, wherein the plate-like member includes a heat conductive sheet.

16. The memory system according to claim 9, wherein the socket further includes a heat dissipation structure that comes into contact with the plate-like member.

17. The memory system according to claim 16, wherein the heat dissipation structure includes a plurality of fins each protruding from a side surface of the plate-like member.

* * * * *